US007561137B2

(12) United States Patent
Fratti et al.

(10) Patent No.: US 7,561,137 B2
(45) Date of Patent: Jul. 14, 2009

(54) COMPARATOR-BASED DRIVERS FOR LCD DISPLAYS AND THE LIKE

(75) Inventors: Roger A. Fratti, Mohnton, PA (US); Yihjye Twu, Scotch Plains, NJ (US)

(73) Assignee: Agere Systems Inc., Allentown, PA (US)

( * ) Notice: Subject to any disclaimer, the term of this patent is extended or adjusted under 35 U.S.C. 154(b) by 681 days.

(21) Appl. No.: 11/166,824

(22) Filed: Jun. 24, 2005

(65) Prior Publication Data

US 2006/0290635 A1 Dec. 28, 2006

(51) Int. Cl.
*G09G 3/36* (2006.01)
*H03K 5/153* (2006.01)

(52) U.S. Cl. .............................. 345/98; 345/94; 327/77

(58) Field of Classification Search ........... 345/98–100; 327/77

See application file for complete search history.

(56) References Cited

U.S. PATENT DOCUMENTS

2004/0095306 A1* 5/2004 Fujiyoshi ..................... 345/94

OTHER PUBLICATIONS

"A Class-B Output Buffer for Flat-Panel-Display Column Driver," by Pang-Cheng Yu and Jin-Chuan Wu; IEEE Journal Of Solid-State Circuits, vol. 54, No. 1, Jan. 1999, pp. 116-119.

* cited by examiner

*Primary Examiner*—Amr Awad
*Assistant Examiner*—Randal Willis
(74) *Attorney, Agent, or Firm*—Mendelsohn, Drucker & Associates, PC; Steve Mendelsohn

(57) ABSTRACT

A comparator-based driver has a configurable inverter that inverts one of the comparator output signals for application to the gate of a driver transistor used to generate the driver output signal. The configurable inverter can be selectively configured to provide any one of at least two different inverter logic threshold levels. In one possible operational scenario, the configurable inverter is configured such that the inverter logic threshold level is equivalent to the comparator's differential common-mode voltage to provide relatively high driver symmetry. The configurable inverter is then configured to provide a different inverter logic threshold level that is greater than the comparator's differential common-mode voltage to inhibit chattering in the driver output signal.

19 Claims, 5 Drawing Sheets

COMPARATOR-BASED DRIVERS FOR LCD DISPLAYS AND THE LIKE

BACKGROUND OF THE INVENTION

1. Field of the Invention

The present invention relates to electronics, and, in particular, to drivers for liquid crystal displays and the like.

2. Description of the Related Art

Liquid crystal displays (LCDs) are a dominant display technology. Depending on the particular application, in an LCD, an image is formed from anywhere from a few up to many thousands of LCD elements on a display screen. In a conventional two-dimensional LCD display having rows and columns of LCD elements (i.e., pixels), each different row and column of LCD elements is driven by an amplifier, such as a Class B amplifier. A Class B amplifier is an amplifier that has a 180-degree conduction angle.

FIG. 1 shows a schematic diagram of a conventional Class B amplifier 100 configured as a comparator-based LCD display driver to drive an LCD element, which is depicted in FIG. 1 as a capacitor 102. In one conventional type of LCD technology, if the voltage stored in capacitor 102 is greater than a certain level, then the corresponding LCD element is on; otherwise, the corresponding LCD element is off. Other LCD technologies include multiple gray-scale and/or color pixels. Depending on the particular implementation, capacitor 102 may represent the total capacitance of one or more LCD elements, such as an entire row or column of LCD elements in a two-dimensional LCD display.

In particular, amplifier 100 includes comparators (e.g., operational amplifiers (op-amps)) A1 and A2, n-type metal-oxide semiconductor field-effect transistor (MOSFET) Q1, p-type MOSFET Q2, and inverter I1. A channel node of each of transistors Q1 and Q2 is connected to driver output node $N_{OUT}$. An input signal $V_{IN}$ is applied via driver input node $N_{IN}$ to the positive input of op-amp A1 and to the negative input of op-amp A2. Output signal $V_{OUT}$ is applied via output node $N_{OUT}$ to one side of capacitor 102, whose other side is connected to reference voltage $V_{SS}$ (e.g., ground). As such, output signal $V_{OUT}$ corresponds to the net charge stored in capacitor 102. Output signal $V_{OUT}$ is also applied as a feedback signal to the negative input of op-amp A1 and to the positive input of op-amp A2.

If the voltage level of input signal $V_{IN}$ is greater than the voltage level of output signal $V_{OUT}$, then op-amp A1 generates a high output signal and op-amp A2 generates a low output signal. The high output signal from op-amp A1 is inverted by inverter I1 into a low signal, which is applied to the gate of N-MOSFET Q1, which is therefore off. The low output signal from op-amp A2 is applied to the gate of P-MOSFET Q2, which is therefore on. Turning on Q2 applies power supply $V_{DD}$ to node $_{OUT}$, thereby charging capacitor 102 (assuming that $V_{DD}$ is greater than $V_{OUT}$).

If the voltage level of input signal $V_{IN}$ is less than the voltage level of output signal $V_{OUT}$, then op-amp A1 generates a low output signal and op-amp A2 generates a high output signal. The high output signal from op-amp A2 is applied to the gate of P-MOSFET Q2, which is therefore off. The low output signal from op-amp A1 is inverted by inverter I1 into a high signal, which is applied to the gate of N-MOSFET Q1, which is therefore on. Turning on Q1 applies reference voltage $V_{SS}$ to node $N_{OUT}$, thereby discharging capacitor 102 (assuming that $V_{SS}$ is less than $V_{OUT}$).

In this way, amplifier 100 functions as an LCD display driver that tends to control the charge stored in capacitor 102 such that the output voltage level $V_{OUT}$ is driven towards $V_{DD}$ or $V_{SS}$ depending on the level of input signal $V_{IN}$. In certain technologies, the LCD element corresponding to capacitor 102 is turned on by driving input node $N_{IN}$ with a high input signal $V_{IN}$ (e.g., 1 volt), and the LCD element is turned off by driving input node $N_{IN}$ with a low input signal $V_{IN}$ (e.g., 0 volts).

In order to save power, amplifier 100 can be designed such that the differential common-mode output voltage of op-amp A1 is lower than the logic threshold of inverter I1 (i.e., the input voltage level at which the output of the inverter switches from low to high and vice versa). As such, if the output voltage level $V_{OUT}$ is close to the input voltage level $V_{IN}$, then both Q1 and Q2 will be off, thereby saving power.

Unfortunately, this difference between the differential common-mode voltage and the inverter logic threshold reduces symmetry of the output driver. Reducing driver symmetry can lead to kinks in the DC transfer function and possible reduction of common-mode range. These problems can worsen when the operational amplifiers have lower gains. The common-mode offset between op-amp A1 and inverter I1 cuts into the accuracy of the driver by inducing an offset between the input voltage $V_{IN}$ and the final output voltage $V_{OUT}$.

As described above, if $V_{OUT}$ is higher than $V_{IN}$, then the output of A1 is low and therefore the output of I1 is high, which turns on Q1 and discharges capacitor 102, thereby lowering $V_{OUT}$. In order to shut off Q1, $V_{OUT}$ must go below the logic threshold of I1. If A1 has unity gain, the static offset on $V_{OUT}$ will be equal to the difference in the common-mode output of A1 and the logic threshold of I1. As the gain of A1 drops, the problems worsen.

Conventional amplifiers, such as amplifier 100 of FIG. 1, can be designed to strike a balance between the competing goals of saving power and providing high driver symmetry, by designing the differential common-mode voltage to be slightly below the inverter's logic threshold. An exemplary conventional Class B amplifier for an LCD display is described by Pang-Cheng Yu and Jiin-Chuan Wu, "A Class-B Output Buffer for Flat-Panel-Display Column Driver," *IEEE Journal of Solid-State Circuits*, Vol. 34, No. 1, January 1999, the teachings of which are incorporated herein by reference. In this LCD display driver, an inverter analogous to inverter I1 of FIG. 1 has a logic threshold of 4.06 V, while the common-mode output of a comparator analogous to op-amp A1 of FIG. 1 is 0.35-0.41 V lower that the inverter's logic threshold.

Unfortunately, if the op-amp's differential common-mode voltage is too close to the inverter's logic threshold, then amplifier 100 can experience undesirable levels of overshoot and ringing. FIG. 2 shows the transfer characteristics of amplifier 100 of FIG. 1, if the op-amp's differential common-mode voltage is too close to the logic threshold of the inverter. In an exemplary amplifier implemented using a typical 0.35-micron CMOS technology, input signal $V_{IN}$ rises linearly from 0 volts (at time 0 nsec) to 1 volt (at time 100 nsec), stays at 1 volt until time 200 nsec, falls linearly from 1 volt back to 0 volts (at time 300 nsec), and stays at 0 volts until time 900 nsec.

As shown in FIG. 2, the resulting output signal $V_{OUT}$ experiences overshoot and ringing at the 1-volt level following time 100 nsec and again at the 0-volt level following time 300 nsec. For the amplifier represented in FIG. 2, there is approximately 2.5% overshoot. This overshoot and ringing (i.e., chattering) can adversely affect the operations of the display driver by causing higher power consumption associated with Q1 and Q2 being repeatedly turned on and off as the output signal rings. Chattering can also result in flickering of the LCD display.

SUMMARY OF THE INVENTION

In one embodiment, the present invention is circuitry comprising a driver (e.g., 100 of FIG. 1) for generating a driver output signal (e.g., $V_{OUT}$) presented at a driver output node (e.g., $N_{OUT}$) based on a driver input signal (e.g., $V_{IN}$) applied at a driver input node (e.g., $N_{IN}$). The driver comprises a first comparator (e.g., A1), a configurable inverter (e.g., I1), and a first output driving device (e.g., Q1). The first comparator compares the driver output signal to the driver input signal in order to generate a comparator output signal. The configurable inverter generates an inverted version of the comparator output signal as an inverter output signal presented at an inverter output node, wherein the configurable inverter is selectively configured to provide any one of at least two different inverter logic threshold levels. The first output driving device is connected to receive, at its control terminal, a signal based on the inverter output signal, wherein an output node of the first output driving device is connected to the driver output node.

In another embodiment, the present invention is, in an LCD driver for providing a voltage signal to an LCD electrode (e.g., 102), a voltage signal generator (e.g., 100) comprising an input node (e.g., $N_{IN}$), an output node (e.g., $N_{OUT}$), a first differential amplifier (e.g., A1), a second differential amplifier (e.g., A2), an inverter (e.g., I1), a first current source (e.g., Q1), and a second current source (e.g., Q2). The first differential amplifier includes first and second input terminals and an output terminal, wherein (a) the first input terminal of the first differential amplifier is coupled so as to receive an input voltage signal (e.g., $V_{IN}$) appearing at the input node of the voltage signal generator and (b) the second input terminal of the first differential amplifier is coupled so as to receive an output voltage signal (e.g., $V_{OUT}$) appearing at the output node of the voltage signal generator. The second differential amplifier includes first and second input terminals and an output terminal, wherein (a) the first input terminal of the second differential amplifier is coupled so as to receive the input voltage signal and (b) the second input terminal of the second differential amplifier is coupled so as to receive the output voltage signal. The inverter has an input terminal and an output terminal, the input terminal of the inverter being coupled to the output terminal of the first differential amplifier. The first current source has a control terminal and an output terminal, wherein (a) the control terminal of the first current source is coupled to the output terminal of the inverter and (b) the output terminal of the first current source is coupled to the output node of the voltage signal generator. The second current source has a control terminal and an output terminal, wherein (a) the control terminal of the second current source is coupled to the output terminal of the second differential amplifier and (b) the output terminal of the second current source is coupled to the output node of the voltage signal generator. The inverter selectively provides any one of at least two different logic threshold levels.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
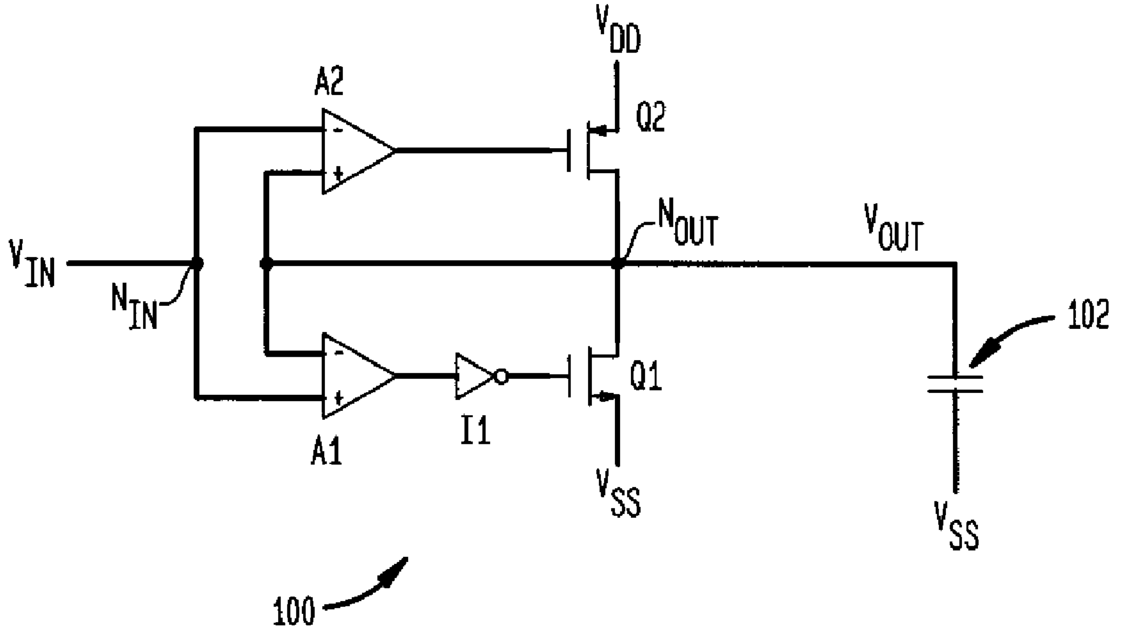
FIG. 1 (PRIOR ART)
FIG. 1 shows a schematic diagram of a conventional Class B amplifier configured as a comparator-based LCD display driver to drive an LCD element.
Figure 3:
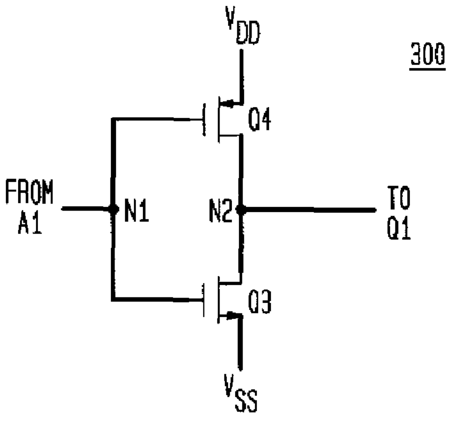
FIG. 3 (PRIOR ART)
FIG. 3 shows a transistor-level diagram of a conventional inverter that can be used for inverter I1 in the LCD display driver of FIG. 1, according to the prior art.

FIG. 3 shows a transistor-level diagram of a conventional inverter 300 that can be used for inverter I1 in comparator-based display driver 100 of FIG. 1. In this prior-art implementation, inverter 300 includes N-MOSFET Q3 and P-MOSFET Q4. The output signal from op-amp A1 of FIG. 1 is applied via inverter input node N1 to the gates of Q3 and Q4, while the signal appearing at inverter output node N2 is applied to the gate of transistor Q1 of FIG. 1.

If the voltage at input node N1 is high (i.e., above the threshold voltages of transistors Q3 and Q4), then Q3 will be on and Q4 will be off, which drives the voltage at output node N2 towards $V_{SS}$ (i.e., low). If the voltage at input node N1 is low (i.e., below the threshold voltages of transistors Q3 and Q4), then Q3 will be off and Q4 will be on, which drives the voltage at output node N2 towards $V_{DD}$ (i.e., high). In this way, inverter I1 of FIG. 1 inverts the signal from op-amp A1 for application to the gate of transistor Q1.

Figure 4:
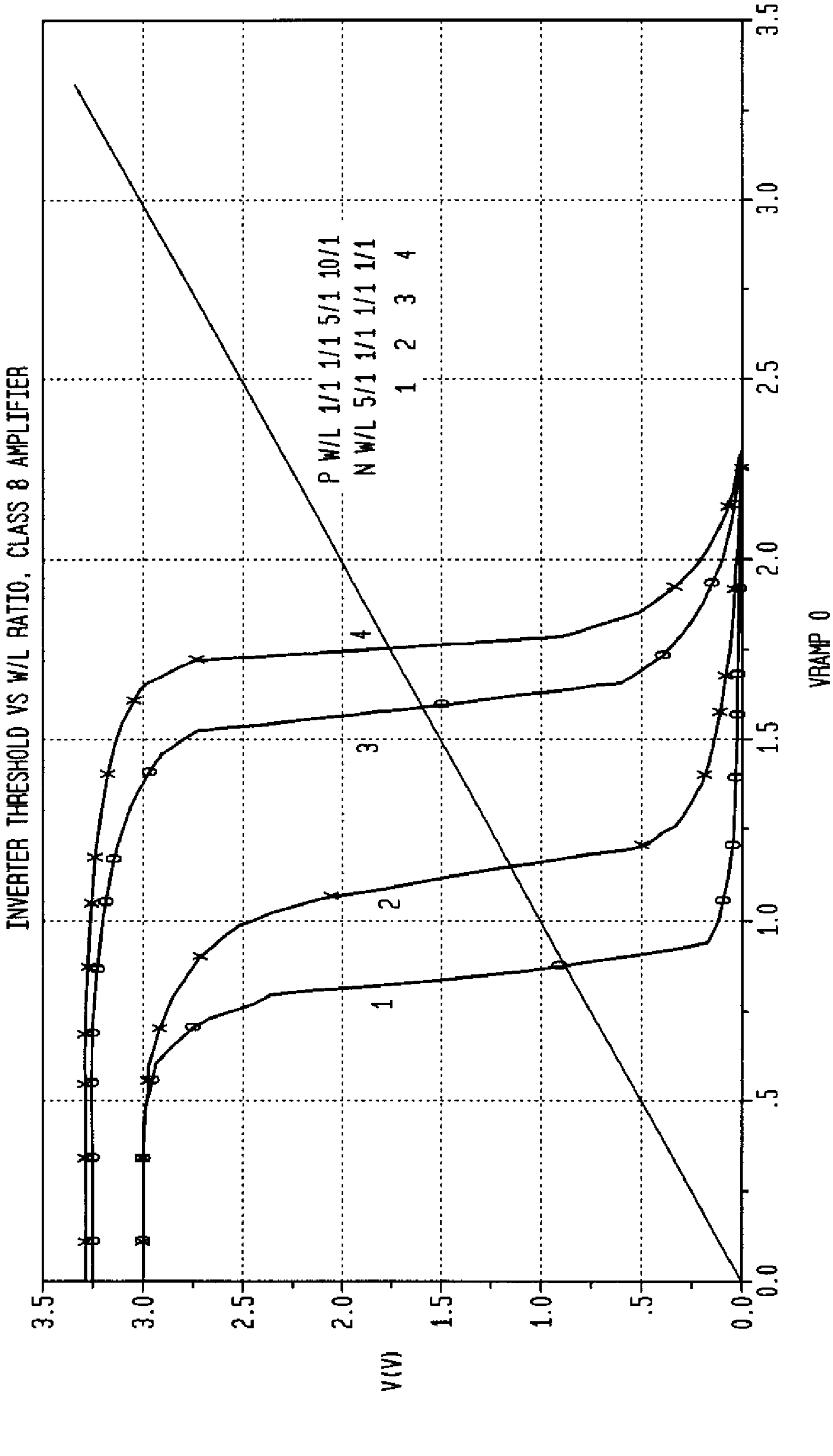
FIG. 4 graphically illustrates the relationship between the inverter's logic threshold and the relative W/L ratios for the p-side and the n-side of the inverter of FIG. 3.

By selecting appropriate dimensions (e.g., channel widths (W) and lengths (L)) for transistors Q3 and Q4, the logic threshold of inverter 300 can be designed to be at a desired level relative to the differential common-mode voltage of op-amp A1 of FIG. 1. For example, increasing the W/L ratio of transistor Q4 relative to the W/L ratio of transistor Q3 will increase the logic threshold of inverter 300. FIG. 4 graphically illustrates the relationship between the inverter's logic threshold and the relative W/L ratios for the p-side and the n-side of the inverter. In particular, FIG. 4 demonstrates that the inverter's logic threshold increases as the W/L ratio for the P-side of the inverter increases relative to the W/L ratio for the inverter's N-side.

Figure 5:
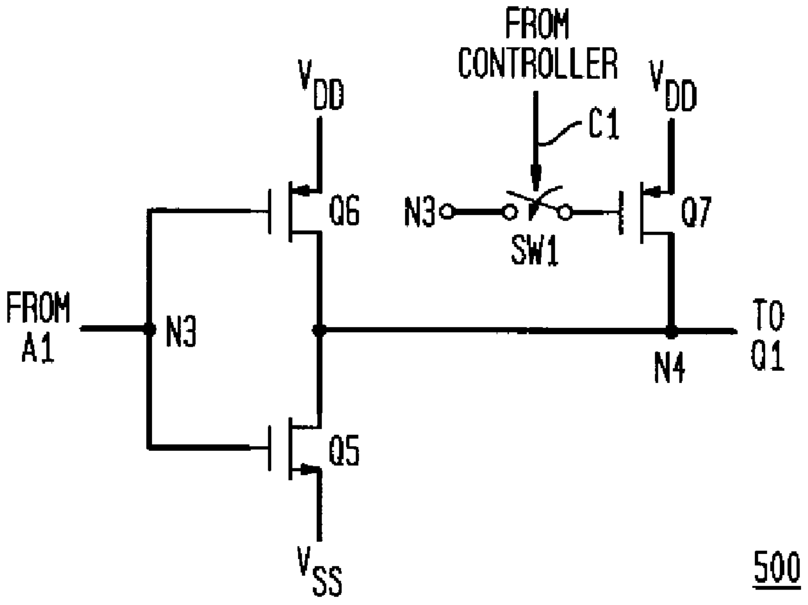
FIG. 5 shows a transistor-level diagram of a configurable inverter that can be used for inverter I1 in the LCD display driver of FIG. 1, according to one embodiment of the present invention.

FIG. 5 shows a transistor-level diagram of configurable inverter 500, which can be used for inverter I1 in comparator-based display driver 100 of FIG. 1, according to one embodiment of the present invention. Configurable inverter 500 includes N-MOSFET Q5, P-MOSFETs Q6 and Q7, and switch SW1. Transistors Q5 and Q6 are analogous to transistors Q3 and Q4 of FIG. 3. The state of switch SW1 (i.e., open or closed) is controlled by control signal C1 generated by a controller (not shown). In one implementation, switch SW1 is a FET transistor connected to receive control signal C1 at its gate node, wherein the FET's channel nodes are connected to node N3 and the gate of Q7.

If switch SW1 is open, then transistor Q7 is off, and inverter 500 operates like conventional inverter 300 of FIG. 3. Different techniques may be employed to ensure that transistor Q7 is off when switch SW1 is open. One such technique would be to connect the gate transistor Q7 to $V_{DD}$ through a (large) pull-up resistor or a transmission gate. In that case, the gate of transistor Q7 will be pulled to $V_{DD}$ when switch SW1 is open, thereby ensuring that Q7 is off.

If, however, switch SW1 is closed, then the inverter input signal from op-amp A1 appearing at node N3 is applied to the gate of Q7 as well as to the gates of Q5 and Q6. In this case, the P-side of inverter 500 is based on the parallel combination of P-MOSFET Q6 and P-MOSFET Q7. Adding Q7 to the P-side of inverter 500 increases the effective size of the P-side of inverter 500 relative to the size of the inverter's N-side, since adding FETs in parallel increases the effective W/L ratio of the combination. This has the effect of raising the logic threshold of inverter 500 (as demonstrated in FIG. 4).

In one implementation of driver 100 of FIG. 1 in which inverter 500 is used for inverter I1, inverter 500 is designed such that, when switch SW1 is open, the inverter's logic threshold (based on only transistors Q5 and Q6) is close to the differential common-mode voltage of op-amp A1, and, when switch SW1 is closed, the inverter's logic threshold (based on all three transistors Q5, Q6, and Q7) is greater than the differential common-mode voltage.

Figure 2:
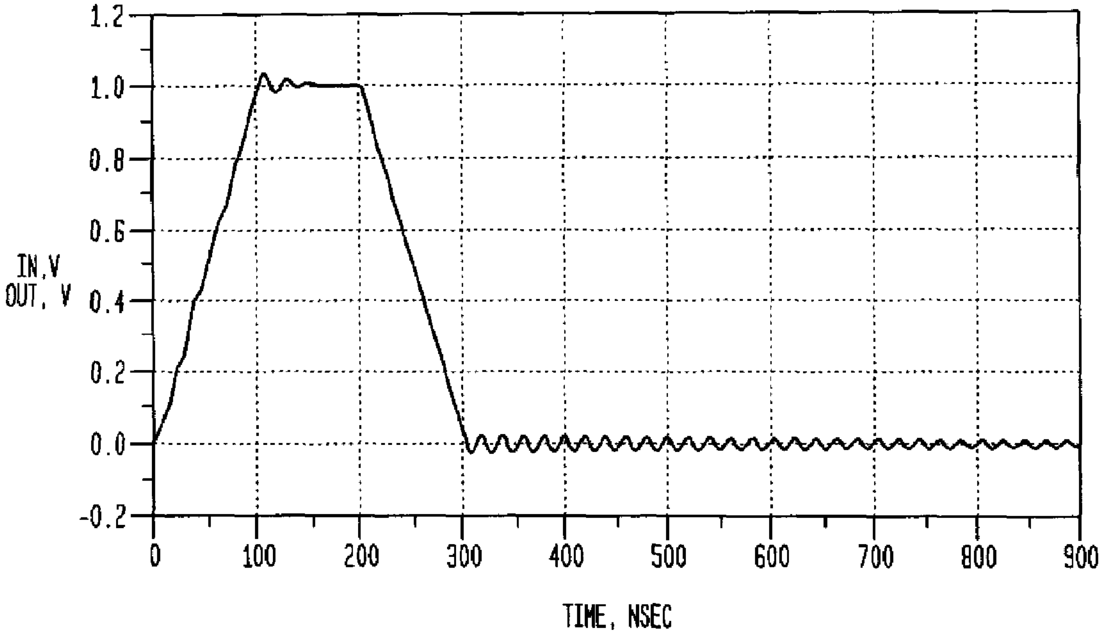
FIG. 2 (PRIOR ART)
FIG. 2 shows the transfer characteristics of the LCD display driver of FIG. 1, if the differential common-mode voltage is too close to the logic threshold of the inverter.
Figure 6:
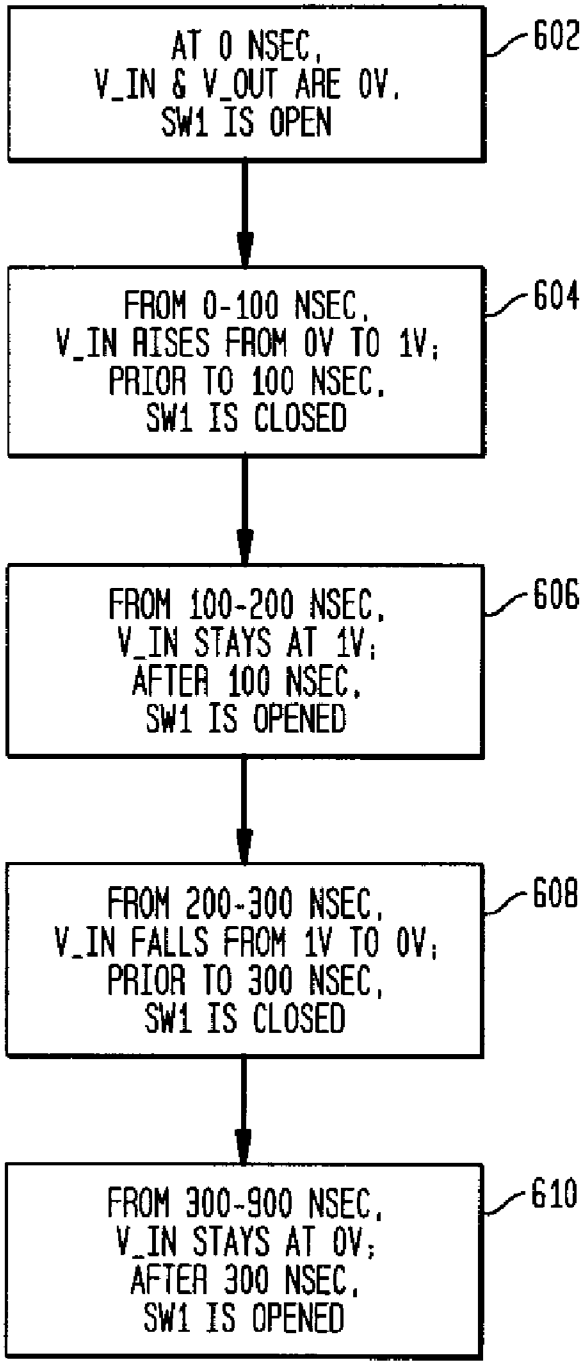
FIG. 6 shows a flow diagram of the operations of the LCD driver of FIG. 1 implemented using the configurable inverter of FIG. 5 for inverter I1 for the exemplary operational scenario of FIG. 2, according to one embodiment of the present invention.

FIG. 6 shows a flow diagram of the operations of LCD driver 100 of FIG. 1 implemented using configurable inverter 500 for inverter I1 for the exemplary operational scenario of FIG. 2, according to one embodiment of the present invention. At time 0 nsec (step 602), input signal $V_{IN}$ and output signal $V_{OUT}$ are both low, and switch SW1 is configured at its open position, such that the inverter's logic threshold is close to the differential common-mode voltage, thereby assuring relatively high driver symmetry.

From time 0 nsec to time 100 nsec (step 604), input signal $V_{IN}$ is increased linearly from 0 V to 1 V, which results in output signal $V_{OUT}$ being driven from low to high. Prior to time 100 nsec, when the level of output signal $V_{OUT}$ (or input signal $V_{IN}$) gets close to the desired high level (e.g., 1 V), switch SW1 is configured to its closed position, such that the inverter's logic threshold is raised relative to the differential common-mode voltage. This will have the effect of reducing the overshoot and ringing that would otherwise occur had the inverter's logic threshold remained close to the differential common-mode voltage.

From time 100 nsec to time 200 nsec (step 606), input signal $V_{IN}$ is maintained at 1 V, which causes output signal $V_{OUT}$ to be maintained high. After a suitable settling time following time 100 nsec, switch SW1 is returned to its open position, thereby returning the inverter's logic threshold back to its lower level to await the next transition.

From time 200 nsec to time 300 nsec (step 608), input signal $V_{IN}$ is decreased linearly from 1 V to 0 V, which results in output signal $V_{OUT}$ being driven from high to low. Prior to time 300 nsec, when the level of output signal $V_{OUT}$ (or input signal $V_{IN}$) gets close to the desired low level (e.g., 0 V), switch SW1 is configured to its closed position, such that the inverter's logic threshold is raised relative to the differential common-mode voltage. Once again, this will have the effect of reducing the overshoot and ringing that would otherwise occur had the inverter's logic threshold remained close to the differential common-mode voltage.

From time 300 nsec to time 900 nsec (step 610), input signal $V_{IN}$ is maintained at 0 V, which causes output signal $V_{OUT}$ to be maintained low. After a suitable settling time following time 300 nsec, switch SW1 is returned to its open position, thereby returning the inverter's logic threshold back to its lower level to await the next transition.

The operational scenario of FIG. 6 is an example of configurable inverter 500 being controlled to provide hysteresis to the inverter's logic threshold.

Depending on the particular implementation, the controller used to generate switch control signal C1 of FIG. 5, may actively monitor the output (or input) signal to determine when to change the configuration of switch SW1. Alternatively, the controller may be programmed to wait specified periods of time (e.g., derived from empirical testing and/or circuit analysis) before changing the state of switch SW1. For example, the signal to open or close switch SW1 may be stored in a latch or flip-flop that is actuated by a delay circuit or may, in certain implementations, be set through software.

The present invention has been described in the context of configurable inverter 500 of FIG. 5, in which an additional P-MOSFET (Q7) can be selectively switched into or out of the P-side of the inverter. The present invention can also be implemented using other designs for a configurable inverter, including those having one or more switchable P-MOSFETs on the inverter's P-side and/or one or more switchable N-MOSFETs on the inverter's N-side. Such configurable inverters may be designed to provide more than two different, selectable logic thresholds for particular driver applications.

Although the present invention has been described in the context of a Class B amplifier having a configurable inverter connected between an op-amp (A1) and an N-MOSFET (Q1), the present invention can be implemented in other contexts. For example, the polarities of the op-amp inputs could be reversed with the configurable inverter connected between op-amp A2 and P-MOSFET Q2. Certain embodiments may include series connections of two or more inverters, one or more of which may be configurable inverters of the present invention.

The present invention has been described in the context of display driver 100 of FIG. 1 having op-amps A1 and A2 and transistors Q1 and Q2. In alternative embodiments, types of comparators may be employed other than op-amps and/or types of output driving devices may be employed other than transistors.

Although the present invention has been described in the context of comparator-based LCD display drivers having Class B amplifiers, the present invention can be implemented in the context of (1) comparator-based drivers for circuitry other than LCD displays, e.g., other types of displays such as electro-luminescent (EL) displays, or drivers for non-display circuitry such as audio drivers, and/or (2) comparator-based drivers having other types of amplifiers, such as Class A or Class A/B amplifiers.

Although the present invention has been described in the context of circuitry implemented using MOSFET technology, the presented invention can also be implemented using other transistor technologies, such as bipolar technology and FET technology other than MOSFET technology.

The present invention may be implemented as circuit-based processes, including possible implementation as a single integrated circuit (such as an ASIC or an FPGA), including integration on the LCD glass, a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. Circuitry comprising a driver for generating a driver output signal presented at a driver output node based on a driver input signal applied at a driver input node, the driver comprising:

a first comparator adapted to compare the driver output signal to the driver input signal in order to generate a comparator output signal;

a configurable inverter adapted to generate an inverted version of the comparator output signal as an inverter output signal presented at an inverter output node, wherein the configurable inverter is adapted to be selectively configured to provide any one of at least two different inverter logic threshold levels;

a first output driving device connected to receive, at its control terminal, a signal based on the inverter output signal, wherein an output node of the first output driving device is connected to the driver output node; and a controller adapted to control the inverter logic threshold level of the configurable inverter to reduce chattering in the driver output signal, wherein the configurable inverter comprises:

a series combination of an n-type transistor and a p-type transistor connected to receive the comparator output signal at their gate nodes and connected at channel nodes to the inverter output node;

an additional transistor connected at a channel node to the inverter output node and in parallel with one of the transistors in the series combination; and a switch adapted to selectively apply the comparator output signal to the gate of the additional transistor in order to change the logic threshold level of the configurable inverter.

2. The invention of claim 1, wherein:

the first comparator is an op-amp; and the first output driving device is a first transistor connected to receive, at its gate node, the signal based on the inverter output signal, wherein a channel node of the first transistor is connected to the driver output node.

3. The invention of claim 1, wherein the driver output node is connected to one or more LCD elements.

4. The invention of claim 3, wherein the circuitry comprises the one or more LCD elements.

5. The invention of claim 1, wherein the additional transistor is a p-type transistor, such that closing the switch raises the logic threshold level of the configurable inverter.

6. The invention of claim 1, wherein the controller is adapted to control the state of the switch in order to reduce the chattering of the driver.

7. The invention of claim 6, wherein the controller changes the state of the switch when a difference between one of the driver signals and a specified signal level is less than a specified threshold value.

8. The invention of claim 1, wherein:

the first comparator is a first op-amp connected to receive the driver input signal at its positive input and the driver output signal at its negative input and is adapted to generate a first op-amp output signal;

the configurable inverter is connected to receive the first op-amp output signal at its input node and is adapted to present an inverted version of the first op-amp output signal at its output node;

the first output driving device is an n-type transistor connected to receive the inverted version of the first op-amp output signal at its gate node;

the driver further comprises:

a second op-amp connected to receive the driver input signal at its negative input and the driver output signal at its positive input and is adapted to generate a second op-amp output signal; and a p-type transistor connected to receive the second op-amp output signal at its gate node; and channel nodes of the n-type and p-type transistors are connected to the driver output node.

9. A method for generating a driver output signal presented at a driver output node based on a driver input signal applied at a driver input node, the method comprising:

(a) comparing the driver output signal to the driver input signal to generate a comparator output signal;

(b) generating, using a configurable inverter, an inverted version of the comparator output signal as an inverter output signal presented at an inverter output node, wherein the configurable inverter is adapted to be selectively configured to provide any one of at least two different inverter logic threshold levels;

(c) applying a signal based on the inverter output signal to a first output driving device connected at an output node to the driver output node; and (d) controlling the inverter logic threshold level of the configurable inverter to reduce chattering in the driver output signal, wherein the configurable inverter comprises:

a series combination of an n-type transistor and a p-type transistor connected to receive the comparator output signal at their gate nodes and connected at channel nodes to the inverter output node;

an additional transistor connected at a channel node to the inverter output node and in parallel with one of the transistors in the series combination; and a switch adapted to selectively apply the comparator output signal to the gate of the additional transistor in order to change the logic threshold level of the configurable inverter.

10. The invention of claim 9, further comprising applying the driver output signal to one or more LCD elements.

11. The invention of claim 9, wherein:

the configurable inverter is configured to provide a first inverter logic threshold level that is equivalent to a driver common-mode voltage to provide relatively high driver symmetry; and the configurable inverter is configured to provide a second inverter logic threshold level that is greater than the driver common-mode voltage to inhibit chattering in the driver output signal.

12. The invention of claim 9, wherein the additional transistor is a p-type transistor, such that closing the switch raises the logic threshold level of the configurable inverter.

13. The invention of claim 9, wherein step (d) comprises controlling the state of the switch in order to reduce the chattering of the driver.

14. The invention of claim 13, comprising changing the state of the switch when a difference between one of the driver signals and a specified signal level is less than a specified threshold value.

15. The invention of claim 13, comprising changing the state of the switch after a specified duration.

16. The invention of claim 9, comprising:

applying (1) the driver input signal at a positive input of a first op-amp and (2) the driver output signal at a negative input of the first op-amp to generate a first op-amp output signal;

presenting an inverted version of the first op-amp output signal at an output node of the configurable inverter;

applying the inverted version of the first op-amp output signal at the gate node of an n-type transistor;

applying (1) the driver input signal at a negative input of a second op-amp and (2) the driver output signal at a positive input of the second op-amp to generate a second op-amp output signal;

applying the second op-amp output signal at the gate node of a p-type transistor, where channel nodes of the n-type and p-type transistors are connected to the driver output node.

17. In an LCD driver for providing a voltage signal to an LCD electrode , a voltage signal generator comprising:

an input node;

an output node;

a first differential amplifier including first and second input terminals and an output terminal, wherein:

the first input terminal of the first differential amplifier is coupled so as to receive an input voltage signal appearing at the input node of the voltage signal generator; and the second input terminal of the first differential amplifier is coupled so as to receive an output voltage signal appearing at the output node of the voltage signal generator;

a second differential amplifier including first and second input terminals and an output terminal, wherein:

the first input terminal of the second differential amplifier is coupled so as to receive the input voltage signal; and the second input terminal of the second differential amplifier is coupled so as to receive the output voltage signal;

an inverter having an input terminal and an output terminal, the input terminal of the inverter being coupled to the output terminal of the first differential amplifier;

a first current source having a control terminal and an output terminal, wherein:

the control terminal of the first current source is coupled to the output terminal of the inverter; and the output terminal of the first current source is coupled to the output node of the voltage signal generator;

a second current source having a control terminal and an output terminal, wherein:

the control terminal of the second current source is coupled to the output terminal of the second differential amplifier; and the output terminal of the second current source is coupled to the output node of the voltage signal generator, wherein the inverter is adapted to selectively provide any one of at least two different logic threshold levels; and a controller adapted to control the logic threshold level of the inverter to reduce chattering in the output voltage signal, wherein the inverter comprises;

a series combination of a p-type transistor and an n-type transistor connected at their gate nodes to the output terminal of the first differential amplifier and connected at channel nodes to the inverter output terminal;

an additional transistor connected at a channel node to the inverter output terminal and in parallel with one of the transistors in the series combination; and a switch adapted to selectively connect output terminal of the first differential amplifier to the gate of the additional transistor in order to change the logic threshold level of the inverter.

18. The invention of claim 17, wherein the controller is adapted to control the state of the switch in order to reduce the chattering in the LCD driver.

19. The invention of claim 18, wherein the controller changes the state of the switch when a difference between a driver signal and a specified signal level is less than a specified threshold value.

* * * * *